United States Patent
Hayashi et al.

(10) Patent No.: US 8,506,186 B2
(45) Date of Patent: Aug. 13, 2013

(54) COATING AND DEVELOPING APPARATUS, COATING AND DEVELOPING METHOD AND NON-TRANSITORY TANGIBLE MEDIUM

(75) Inventors: Shinichi Hayashi, Koshi (JP); Yuichi Douki, Koshi (JP); Akira Miyata, Koshi (JP); Yuuichi Yamamoto, Tokyo-To (JP); Kousuke Yoshihara, Koshi (JP); Nobuaki Matsuoka, Koshi (JP); Suguru Enokida, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 160 days.

(21) Appl. No.: 13/225,985

(22) Filed: Sep. 6, 2011

(65) Prior Publication Data

US 2012/0063765 A1    Mar. 15, 2012

(30) Foreign Application Priority Data

Sep. 13, 2010 (JP) ................................. 2010-204772

(51) Int. Cl.
 *G03D 5/00* (2006.01)
(52) U.S. Cl.
 USPC ......................................................... 396/611
(58) Field of Classification Search
 USPC ........................................................ 396/611
 See application file for complete search history.

(56) References Cited

U.S. PATENT DOCUMENTS

| | | | |
|---|---|---|---|
| 6,290,405 B1* | 9/2001 | Ueda .............................. | 396/611 |
| 6,402,400 B1* | 6/2002 | Ueda et al. .................... | 396/611 |
| 7,267,497 B2* | 9/2007 | Akimoto et al. .............. | 396/611 |
| 7,322,756 B2* | 1/2008 | Akimoto et al. .............. | 396/611 |
| 7,661,894 B2 | 2/2010 | Matsuoka et al. | |
| 7,789,577 B2* | 9/2010 | Matsuoka et al. ............ | 396/611 |
| 2008/0266532 A1* | 10/2008 | Matsuoka et al. ............... | 355/27 |
| 2009/0013932 A1* | 1/2009 | Sakamoto ...................... | 118/719 |
| 2012/0009528 A1* | 1/2012 | Matsuoka et al. ............ | 430/325 |
| 2012/0057861 A1* | 3/2012 | Matsuoka et al. ............ | 396/611 |

FOREIGN PATENT DOCUMENTS

JP    2007-115831 A1    5/2007

* cited by examiner

*Primary Examiner* — Rodney Fuller
(74) *Attorney, Agent, or Firm* — Burr & Brown

(57) ABSTRACT

A process block including a group of liquid-process related unit blocks, a first heating-process related block arranged on a carrier block side of the group of unit blocks, and a second heating-process related block arranged on an interface block side of the group of unit blocks. The group of liquid-process unit blocks includes doubled unit blocks for preprocessing for forming an antireflection film and a resist film, doubled unit blocks for post-processing for forming an upper layer film and performing a cleaning operation before exposure, and a unit block for developing. The first heating-process related block heats a substrate coated with a resist liquid and a substrate that has been developed. The second heating-process related block heats a substrate that has been exposed but is not yet developed, a substrate on which an antireflection film has been formed and a substrate on which an upper layer film has been formed.

5 Claims, 11 Drawing Sheets

COATING AND DEVELOPING APPARATUS, COATING AND DEVELOPING METHOD AND NON-TRANSITORY TANGIBLE MEDIUM

CROSS-REFERENCE TO RELATED APPLICATION

This application is based on and claims the benefit of priority to Japanese Patent Application No. 2010-204772 filed on Sep. 13, 2010, the entire contents of which are incorporated herein by reference.

FIELD OF THE INVENTION

The present invention relates to a coating and developing apparatus, a coating and developing method and a non-transitory tangible medium, for forming a resist onto a substrate and developing the resist after exposure.

BACKGROUND ART

In a photolithography process which is one of semiconductor manufacturing processes, a resist is coated onto a surface of a semiconductor wafer (hereinafter referred to as "wafer"), the resist is exposed in a predetermined pattern, and then the resist is developed to form a resist pattern. A coating and developing apparatus for forming such a resist pattern is provided with a process block including process modules for subjecting the wafer to various kinds of processes.

As described in JP2007-115831A, for example, the process block is structured by stacking unit blocks that form various kinds of coating films such as a resist film, and a unit block that performs a developing process, on one another. Each of the unit blocks is provided with a wafer transfer mechanism. A wafer is sequentially transferred by the transfer mechanism to a process module disposed in each unit block, and is subjected to a process.

In order to cope with miniaturization of a pattern to be formed in a wafer, a variety of process modules are provided to the coating and developing apparatus. For example, in addition to a resist-film forming module that forms a resist film on a wafer by supplying a resist onto the wafer, and a developing module that develops the resist by supplying a developing liquid onto the wafer, the coating and developing apparatus sometimes includes a module that forms an antireflection film below the resist film, a module that forms a protective film for immersion exposure on the wafer, and so on. It has been under review how to decrease an installation area of the coating and developing apparatus including these various kinds of modules.

In addition, in the coating and developing apparatus of JP2007-115831A, the wafer is sequentially transferred among the modules in respective layers. Thus, when one module cannot process the wafer, the wafer cannot be transferred to the succeeding module, which may lower a process efficiency. Thus, there has been desired a coating and developing apparatus having a small installation area, which is capable of preventing lowering of process efficiency.

SUMMARY OF THE INVENTION

The present invention has been made in view of the above circumstances. The object of the present invention is to provide a technique which can restrain lowering of process efficiency of a coating and developing apparatus, and can reduce an installation area of the apparatus.

In one embodiment, there is provided a coating and developing apparatus including: a carrier block; a process block to which a substrate that has been loaded into the carrier block by a carrier is delivered, the process block being configured to form a coating film including a resist film on the substrate; an interface block arranged on an opposed side of the carrier block with respect to the process block; and an exposure apparatus configured to expose the substrate that has been transferred thereto form the process block via the interface block; the substrate that has been loaded into the carrier block by the carrier is delivered to the process block, a coating film including a resist film is formed on the substrate in the process block, the substrate is transferred to the exposure apparatus via the interface block, the exposed substrate, which has been returned to the process block via the interface block, is developed in the process block, and the developed substrate is delivered to the carrier block; in the process block, there are arranged a group of liquid-process related unit blocks arranged on the carrier block side, a first heating-process related block arranged on the carrier block side of the group of liquid-process related unit blocks, a second heating-process related block arranged on the interface block side of the group of liquid-process related unit block; the group of liquid-process related unit blocks are composed of: a first unit block for preprocessing and a second unit block for preprocessing which are doubled and stacked on one another in an up and down direction, each unit block for preprocessing including a liquid process module for a lower layer configured to supply a chemical liquid for forming an antireflection film as a lower layer on the substrate, a coating module configured to supply a resist liquid for forming a resist film on the antireflection film, and a transfer mechanism for the unit block configured to be moved along a linear transfer path connecting the carrier block and the interface block for transferring a substrate between the modules; a first unit block for post-processing and a second unit block for post-processing which are doubled, stacked on one another in the up and down direction and stacked above the unit blocks for preprocessing, each unit block for post-processing including a liquid process module for an upper layer configured to supply a chemical liquid for forming an upper layer film on the substrate on which a resist film has been formed, a cleaning module configured to perform a cleaning operation before exposure, and a transfer mechanism for the unit block configured to be moved along a linear transfer path connecting the carrier block and the interface block for transferring a substrate between the modules; and a unit block for developing stacked on the unit blocks for preprocessing, including a liquid process module configured to supply a developing liquid to the substrate, and a transfer mechanism for the unit block configured to be moved along a linear transfer path connecting the carrier block and the interface block; in the first heating-process related block, there are provided: a plurality of heating modules stacked on one another in the up and down direction in which a heating module configured to heat the substrate to which the resist liquid has been coated in the unit block for preprocessing, and a heating module configured to heat the substrate that has been developed in the unit block for developing are allocated to these heating modules; and a first heating-process related transfer mechanism capable of being moved upward and downward for transferring the substrate among the heating modules; in the second heating-process related block, there are provided: a plurality of heating modules stacked on one another in the up and down direction in which a heating module configured to heat the substrate to which a chemical liquid for forming an antireflection film has been coated in the unit block for preprocessing, a heating module configured to heat the substrate to which a chemical liquid for forming an upper layer film has been coated in the unit block for post-processing, and a heating module configured to heat the substrate which is not yet developed in the unit block for developing are allocated to these heating modules, and a second heating-process related transfer mechanism capable of being moved upward and downward for transferring the substrate among the heating modules; disposed on the carrier block side of the unit block for developing is a delivery stage to which the developed substrate is carried by the transfer mechanism, and disposed on the carrier block side of the unit block for preprocessing is a delivery stage via which the substrate carried out from the carrier is delivered to the transfer mechanism of this unit block; disposed on the carrier block side of the unit block for preprocessing is a delivery stage via which the substrate coated with the resist liquid is carried to the first heating-process related block, and disposed on the carrier block side of the unit block for post-processing is a delivery stage on which the substrate with the resist film formed thereon is received by the transfer mechanism of this unit block; disposed on the interface block side of the unit block for preprocessing are a delivery stage via which the substrate coated with the antireflection film is carried to the second heating-process related block and a delivery stage on which the substrate heated in the second heating-process related block is received by the transfer mechanism of this unit block, and disposed on the interface block side of the unit block for post-processing is a delivery stage via which the substrate with an upper layer film formed thereon is delivered to the transfer mechanism of the second heating-process related block.

The concrete aspects of the coating and developing apparatus are as follows.

(1) In the first heating-process related block, there are provided: unit portions that are stacked on one another at plural levels, each unit portion including, when a direction along which the linear transfer path extends is a back and forth direction, a linear transfer path extending in the back and forth direction, a plurality of heating modules disposed along the liner transfer path; and a horizontal transfer mechanism configured to be moved along the linear transfer path for transferring the substrate among the heating modules and the delivery stages; and an up and down transfer mechanism configured to transfer the substrate among the respective unit portions.

(2) The unit block for developing further includes a cleaning module configured to clean the exposed substrate, the substrate being delivered thereto by the transfer mechanism for this unit block.

In another embodiment, there is provided a coating and developing method, employing the aforementioned coating and developing apparatus, the method including: transferring a substrate, to which a chemical liquid for forming an antireflection film has been coated in the unit block for preprocessing, to the second heating-process related block; transferring then the substrate, which has been heated in the heating module of the second heating-process related block, to the unit block for preprocessing by the second heating-process related transfer mechanism; transferring the substrate, to which a resist liquid has been formed in the unit block for preprocessing, to the first heating-process related block; transferring the substrate to the unit block for post-processing by the first heating-process related transfer mechanism; and transferring substrate, to which a chemical liquid for forming an upper layer film has been coated in the unit block for post-processing, to the second heating-process related block.

In yet another embodiment, there is provided a non-transitory tangible medium storing a computer program for use in a coating and developing apparatus, the computer program being a program for performing the aforementioned coating and developing method.

A process block constituting the coating and developing apparatus of the present invention is composed of a stacked body in which doubled unit blocks for preprocessing each including a liquid process module for forming an antireflection film, a coating module for forming a resist film and a transfer mechanism for the unit blocks, doubled unit blocks for post-processing each including a liquid process module for an upper layer, a cleaning module for performing a cleaning operation before exposure and a transfer mechanism for the unit block, and a unit block for developing including a developing module for performing a developing process and a transfer mechanism for the unit block; and heating-process related blocks disposed on the carrier block side of the stacked body and the interface block side thereof. Thus, an installation area of the apparatus can be reduced. Further, even when one of the unit blocks for preprocessing or post-processing becomes unavailable, a substrate can be processed by the other unit block, whereby lowering of process efficiency can be restrained.

DETAILED DESCRIPTION OF THE INVENTION

First Embodiment

Figure 1:
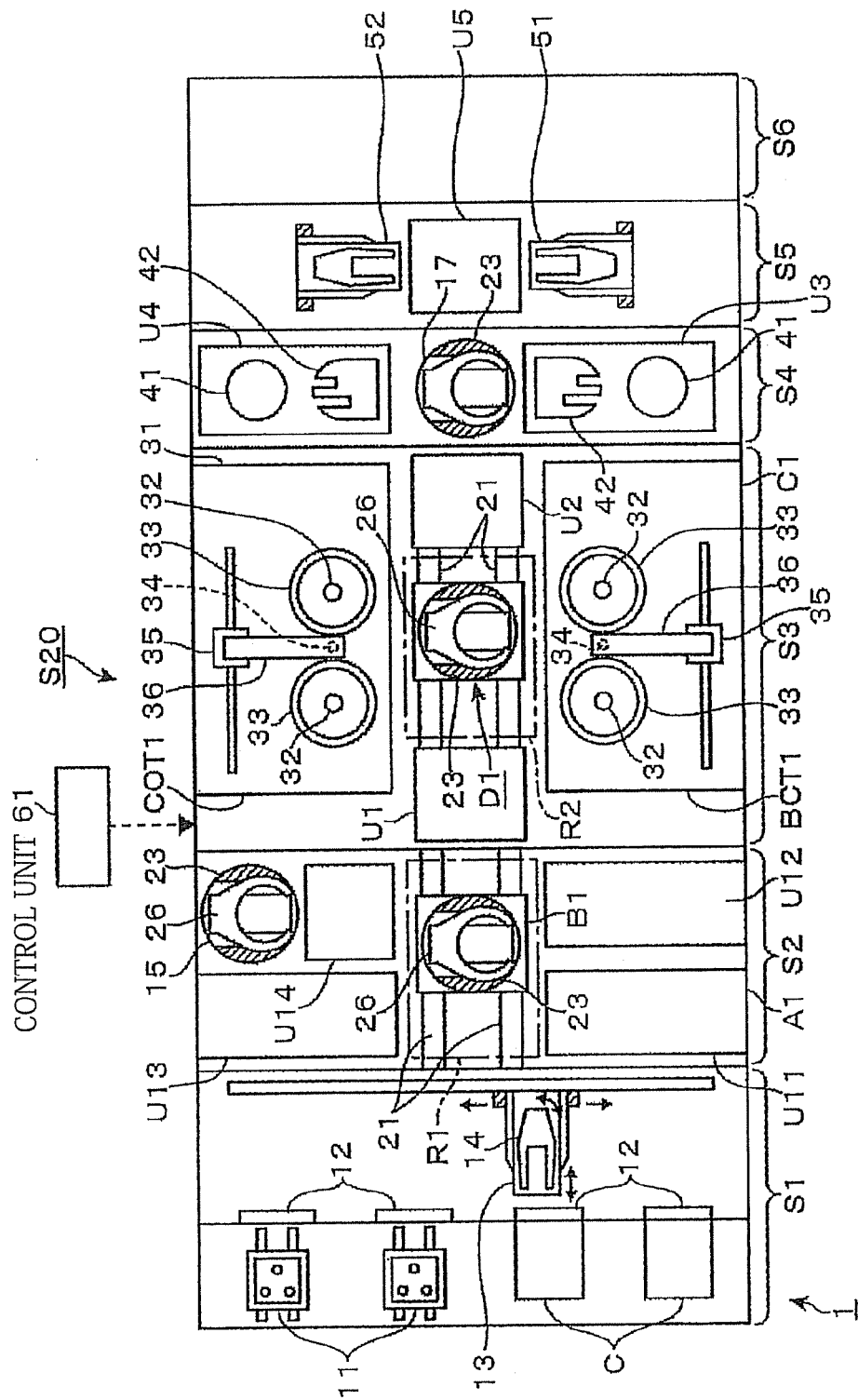
FIG. 1 is a plan view of a coating and developing apparatus of the present invention.

A coating and developing apparatus 1 according to the present invention will be described below with reference to FIGS. 1 to 3 which are a plan view of the coating and developing apparatus 1, a perspective view thereof and a longitudinal sectional side view thereof. In the coating and developing apparatus 1, a carrier block S1, a process block S20 and an interface block S5 are linearly connected to each other. An exposure apparatus S6 for performing an immersion exposure process is connected to the interface block S5. The process block S20 is composed of a front heating-process related block S2, a liquid process block S3 and a rear heating-process related block S4, which are arranged from a side of the carrier block S1 to a side of the interface block S5. The front heating-process related block S2 is a first heating-process related block. The liquid process block S3 is a liquid-process related unit block group. The rear heating-process related block S4 is a second heating-process related block.

The carrier block S1 is a block through which wafers are loaded and unloaded to and from a carrier C hermetically accommodating a plurality of wafers W, e.g., twenty five wafers W as substrates. The carrier block S1 includes a table 11 on which the carrier C is placed, an opening and closing part 12 formed in a wall surface in front of the table 11, and a delivery arm 13 that takes out the wafer W from the carrier C via the opening and closing part 12.

The delivery arm 13 has five wafer holders 14 arranged in an up and down direction. The delivery arm 13 is configured to be movable forward and rearward, movable upward and downward, rotatable about a vertical axis, and movable in a direction along which the carriers C are arranged. The delivery arm 13 is adapted to deliver the five wafers W as a batch from the carrier C to delivery modules BU11 and BU12 of the process block S20. Herein, a place on which the wafer W can be placed is referred to as "module". Among these modules, the module configured to perform a process, such as a heating process, a liquid process, a gas supplying process and so on, to the wafer W is referred to as "process module". Among these process modules, the module configured to supply a chemical liquid or a cleaning liquid to the wafer W is referred to as "liquid process module".

Next, the front heating-process related block S2 is described below. The front heating-process related block S2 is constituted by stacking first to sixth heating-process related unit blocks A1 to A6 that are unit portions separated from each other by partition walls. The heating-process related unit blocks A have substantially the same configuration. Herein, the first heating-process related unit block A1 shown in FIG. 1 is described as a representative of these heating-process related unit blocks.

On the assumption that the side of the carrier block S1 is a front side and that the side of the interface block S5 is a rear side, formed in a center of the first heating-process related unit block A1 is a transfer area R1 which is a linear transfer path extending in the back and forth direction. The transfer area R1 is provided with a main arm B1 that is a transfer mechanism of a wafer W. The main arm B1 will be described below. On one of the right and left sides of the transfer area R1, shelf units U11 and U12 are arranged in this order toward the rear side. On the other side of the right and left sides of the transfer area R1, a shelf unit U13 is located oppositely to the shelf unit U11. In addition, a shelf unit U14 is disposed on the rear side of the shelf unit U13. The shelf unit U14 is disposed such that the shelf unit U14 bridges the first to sixth heating-process related unit blocks A1 to A6.

In each of the shelf units U11 to U13 of the first heating-process related unit block A1, hydrophobing process modules ADH are stacked at multiple levels, e.g., two levels. In the shelf unit U13, the delivery module BU11 is further stacked on each hydrophobing process module ADH. In addition, in the shelf unit U14, a delivery module TRS11 is located at a height position corresponding to that of the first heating-process related unit block A1.

Figure 4:
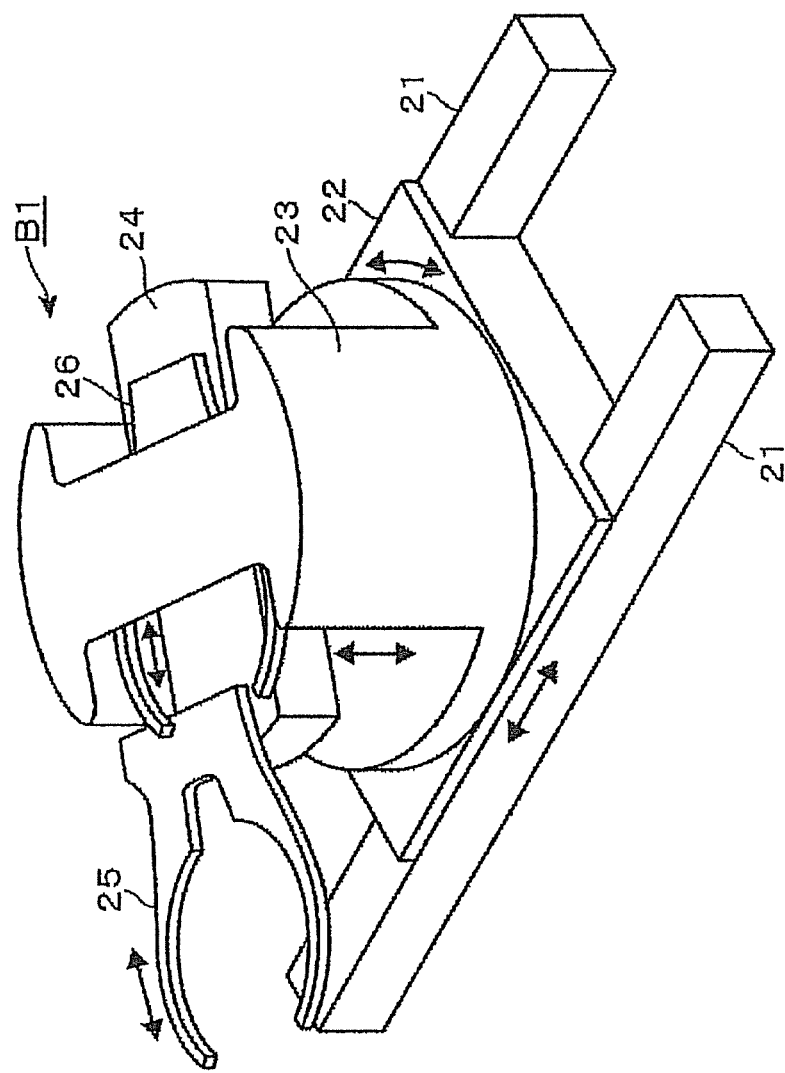
FIG. 4 is a perspective view of a main arm disposed on the coating and developing apparatus.

FIG. 4 is a perspective view of the main arm B1 forming a horizontal transfer mechanism. The main arm B1 includes: guide rails 21 extending in the transfer area R1 in the back and forth direction; a horizontal moving table 22 adapted to move along the guide rails 21; a frame 23 disposed on the horizontal moving table 22 so as to be rotatable about a vertical axis; a base table 24; and wafer holders 25 and 26. The base table 24 is supported on the frame 23 so as to be movable upward and downward. The wafer holders 25 and 26 are supported on the base table 24 and movable forward and rearward from the base table 24 independently of each other. Due to such a structure, the main arm B1 can transfer the wafer W among the respective modules of the first heating-process related unit block A1.

The respective modules are described below. The hydrophobing process module ADH is a process module that heats the wafer W and supplies a process gas onto a surface of the wafer W including a bevel portion (peripheral portion). The hydrophobing process module ADH has a function for improving a hydrophobicity of the surface, and restraining peeling of respective films from the peripheral portion upon an immersion exposure process. The delivery module BU11 is a module to which the wafer W is delivered from the carrier C. In order that the wafers W transferred from the aforementioned delivery arm 13 as a batch, the delivery module BU11 has five stages on which the wafers W can be placed, the stages being arranged in the up and down direction. The wafers W transferred to the delivery module BU11 are taken out one by one from the delivery module BU11, and subjected to a process. The delivery module has a stage on which the wafer W can be placed. The delivery module described as BU has stages on which the plurality of wafers W can be placed, respectively, and can hold the wafers W placed thereon.

The other heating-process related unit blocks A are described, focusing on differences thereof from the first heating-process related unit block A1. The second heating-process related unit block A2 has the same configuration as that of the first heating-process related unit block A1. The shelf unit U13 is provided with the delivery module BU12 corresponding to the delivery module BU11. The shelf unit U14 is provided with a delivery module TRS12 corresponding to the delivery module TRS11.

In the third heating-process related unit block A3 and the fourth heating-process related unit block A4, the shelf units U11 to U13 are provided with heating modules PAB in place of the hydrophobing process modules ADH. The heating module PAB is a module that heats a wafer W coated with a resist. The shelf unit U14 is provided with delivery modules TRS13 and TRS14 corresponding to the delivery module TRS11.

In the fifth heating-process related unit block A5 and the sixth heating-process related unit block A6, the shelf units U11 to U13 are provided with heating modules POST in place of the hydrophobing process modules ADH. The heating module POST is a module that heats a developed wafer W. Similarly to the shelf units U11 to U13, in the shelf unit U14, the heating modules POST are stacked at two levels. In addition, in the fifth heating-process related unit block A5 and the sixth heating-process related unit block A6, the shelf units 13 are provided with delivery modules BU13 and BU14, respectively. The delivery modules BU13 and BU14 are modules that return a wafer W to the carrier C.

Figure 5:
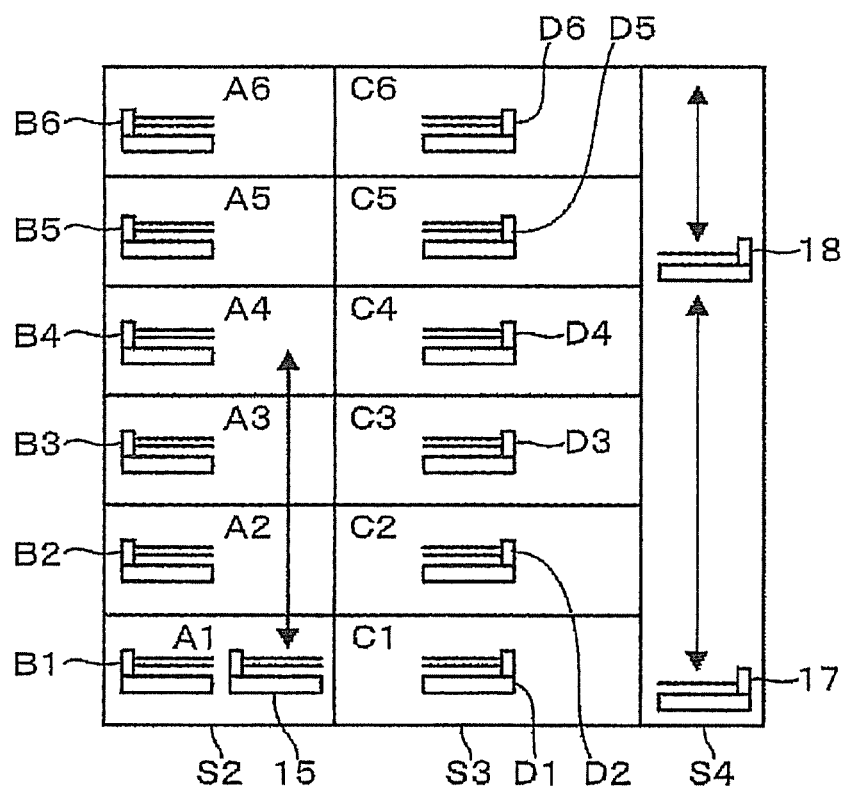
FIG. 5 is a schematic side view of a process block of the coating and developing apparatus.

FIG. 5 is a schematic view showing positioning of the transfer mechanisms of a wafer W in the coating and developing apparatus 1. As shown in FIG. 5, there is disposed a delivery arm 15 shared by the first to fourth heating-process related blocks A1 to A4. The delivery arm 15 serving as an up and down transfer mechanism is located in the vicinity of the shelf unit U14. The delivery arm 15 can be moved upward and downward via respective height positions corresponding to those of the heating-process related unit blocks A1 to A4. The delivery arm 15 can be moved forward and rearward with respect to the shelf unit U14, so that a wafer W can be transferred among the delivery modules TRS11 to TRS14. In addition, as shown in FIG. 5, the heating-process related unit blocks A2 to A6 are provided with main arms B2 to B6 corresponding to the main arm B1. The main arms B1 to B6 transfer wafers W independently of each other. These main arms B1 to B6 and the delivery arm 15 constitute a first heating-process related transfer mechanism.

Next, the liquid process block S3 is described below. The liquid process block S3 is constituted by stacking upward liquid-process unit blocks C1 to C6. The liquid-process unit blocks C1 to C6 are adjacent to the heating-process related unit blocks A1 to A6, respectively. The liquid-process unit blocks C1 to C6 are structured to have the same layout in plan view. FIG. 1 shows the first liquid-process unit block B1 that is a first unit block for preprocessing. Herebelow, the first liquid-process unit block B1 is described as a representative of these liquid-process unit blocks. Formed in a center of the first liquid-process unit block B1 is a transfer area R2 which is a linear transfer path extending in the back and forth direction. On the right and left sides of the transfer area R2, an antireflection-film forming module BCT1 and a resist-film forming module COT1 are located oppositely to each other. The transfer area R2 is provided with a main arm D1. The main arm D1 has the same configuration as that of the main arm B. The main arm D1 can be moved along the transfer area R2 so as to transfer a wafer W among the respective modules of the first liquid-process unit block B1.

The resist-film forming module COT1 that is a coating module is described. The resist-film forming module COT1 includes a housing 31. In the housing 31, two spin chucks 32 are arranged along the transfer area R1. Each of the spin chucks 32 is adapted to absorb and hold a central portion of the rear surface of the wafer W, and is configured to be rotatable about the vertical axis. The reference number 33 depicts a process cup having an upper opening. The process cup 33 surrounds the periphery of the spin chuck 32 so as to restrain scattering of a resist. When the wafer W is processed, the wafer W is accommodated in the process cup 33, with the central portion of the rear surface of the wafer W being held by the spin chuck 32.

In addition, the resist-film forming module COT1 is provided with a nozzle 34 for common use in the respective process cups 33. In the drawings, the reference number 35 depicts a drive mechanism. The drive mechanism 35 is adapted to move the nozzle 34 through an arm 36 in the arrangement direction of the process cups 33, and to move the nozzle 34 upward and downward through the arm 36. The nozzle 34 is moved by the drive mechanism 35 between the process cups 33, and discharges a resist liquid onto the center of the wafer W which has been delivered to each spin chuck 32. The discharged resist liquid is extended to the peripheral edge of the wafer W by a centrifugal force of the wafer W that is rotated about the vertical axis by the spin chuck 32, so that a resist film is deposited on the wafer W. Although not shown, the resist-film forming module COT1 has a nozzle for supplying a solvent onto the peripheral part of the wafer W so as to remove an unnecessary film on the peripheral part. The antireflection-film forming module BCT1 that is a liquid-process module for a lower layer has the same configuration as that of the resist-film forming module COT1, but a chemical liquid for forming an antireflection film, in place of the resist liquid, is discharged from the nozzle 34.

Figure 6:
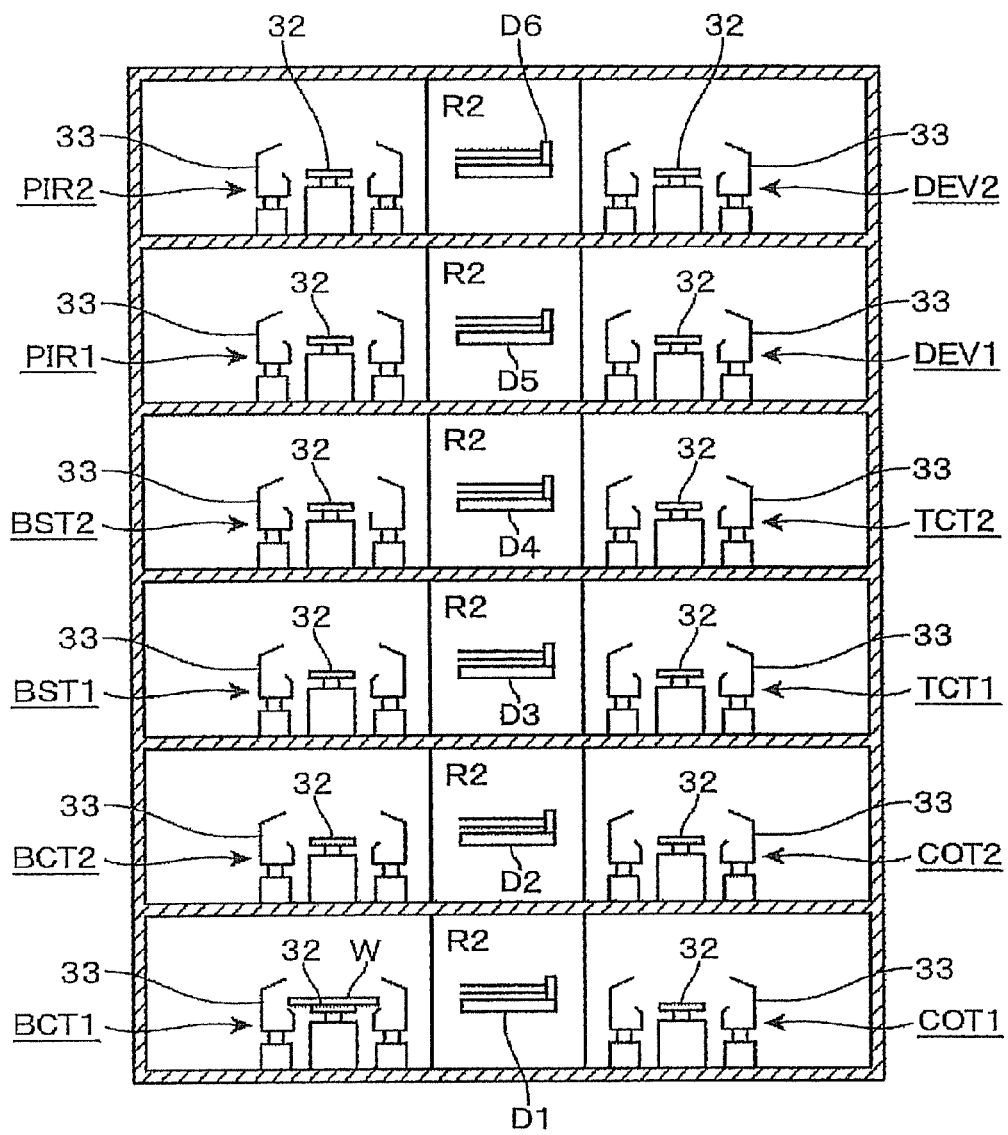
FIG. 6 is a longitudinal sectional front view of a liquid-process unit block.

FIG. 6 is a longitudinal sectional front view of the liquid process block S3. The other liquid-process unit blocks C2 to C6 are briefly described with reference also to FIG. 6. As shown in FIG. 5, the liquid-process unit blocks C2 to C6 are provided with main arms D2 to D6 corresponding to the main arm D1. The main arms D1 to D6 transfer wafers W independently of each other. The second liquid-process unit block. C2 is a second unit block for preprocessing, and has the same configuration as that of the first liquid-process unit block C1. An antireflection-film forming module and a resist-film forming module disposed in the second liquid-process unit block C2 are shown as BCT2 and COT2, respectively.

Differently from the liquid-process unit block C1, the liquid-process unit block C3 includes a protective-film forming module TCT1 that is a liquid process module for an upper layer and a rear-surface cleaning module BCT1, in place of the antireflection-film forming module and the resist-film forming module. The protective-film forming module TCT1 has the same configuration as that of the resist-film forming module COT, but a chemical liquid for forming a protective film, in place of the resist liquid, is discharged from the nozzle 34. This protective film is water repellent, and thus has a function for preventing a liquid from permeating the resist film and the antireflection film, upon an immersion exposure process. In place of the nozzle 34, the rear-surface cleaning module BCT1 is provided with a nozzle for supplying a cleaning liquid onto a rear surface of a wafer W. When the cleaning liquid is supplied to the rear surface of the rotating wafer W from this nozzle, the rear surface is cleaned. The fourth liquid-process unit block C4 has the same configuration as that of the third liquid-process unit block C3. In the drawings, the protective-film forming module and the rear-surface cleaning module disposed on the fourth liquid-process unit block C4 are shown as TCT2 and BST2, respectively. The liquid-process unit blocks C3 and C4 respectively form unit blocks for post-processing.

Differently from the liquid-process unit block C1, the fifth liquid-process unit block C5 includes a developing module DEV1 and an after-exposure cleaning module PIR1, in place of the antireflection-film forming module and the resist-film forming module. The developing module DEV1 has the same configuration as that of the resist-film forming module COT, but a developing liquid, in place of the resist liquid, is discharged from the nozzle 34. In addition, the after-exposure cleaning module PIR1 has the same configuration as that of the resist-film forming module COT, but a process liquid for removing a protective film or a cleaning liquid, in placed of the resist liquid, is discharged from the nozzle 34. The sixth liquid-process unit block C6 has the same configuration as that of the fifth liquid-process unit block C5. In the drawings, the developing module and the after-exposure cleaning module disposed on the sixth liquid-process unit block C6 are shown as DEV2 and PIR2, respectively. In this manner, the liquid process block S4 is constituted by stacking the three types of doubled unit blocks, each of the unit blocks having the same configuration.

Figure 2:
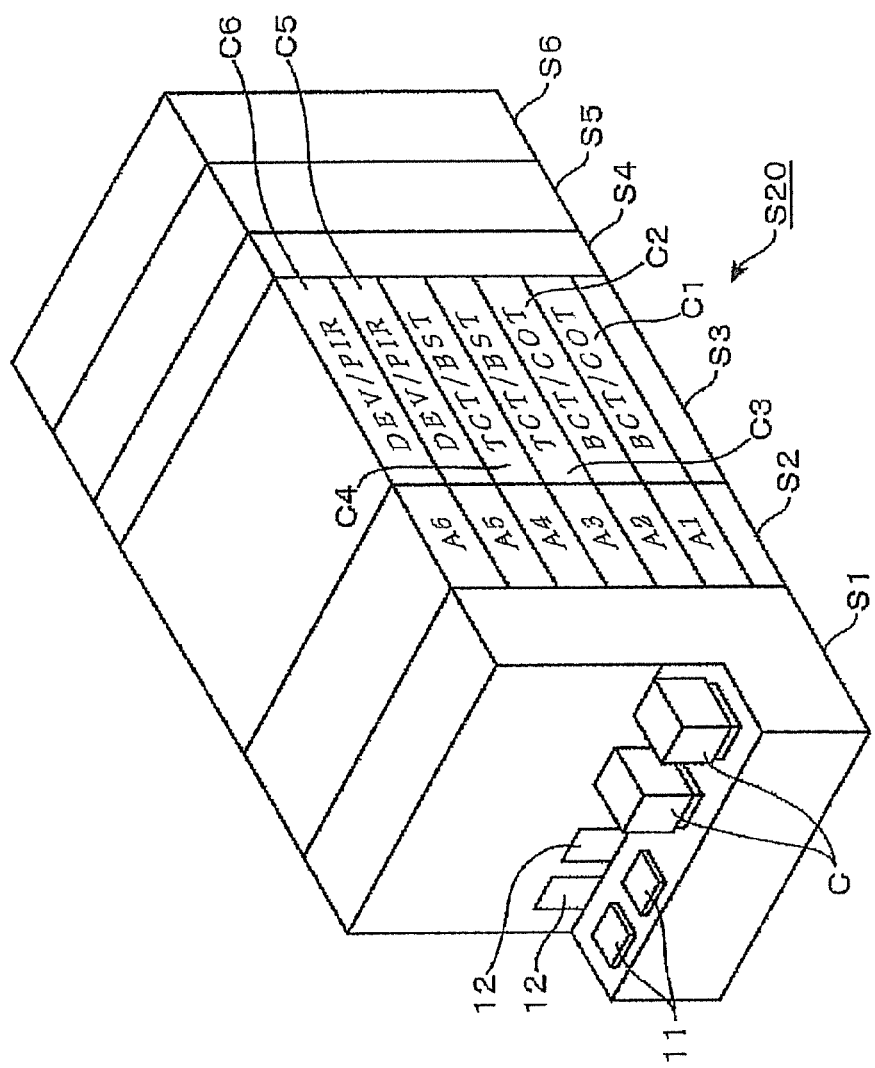
FIG. 2 is a perspective view of the coating and developing apparatus.
Figure 3:
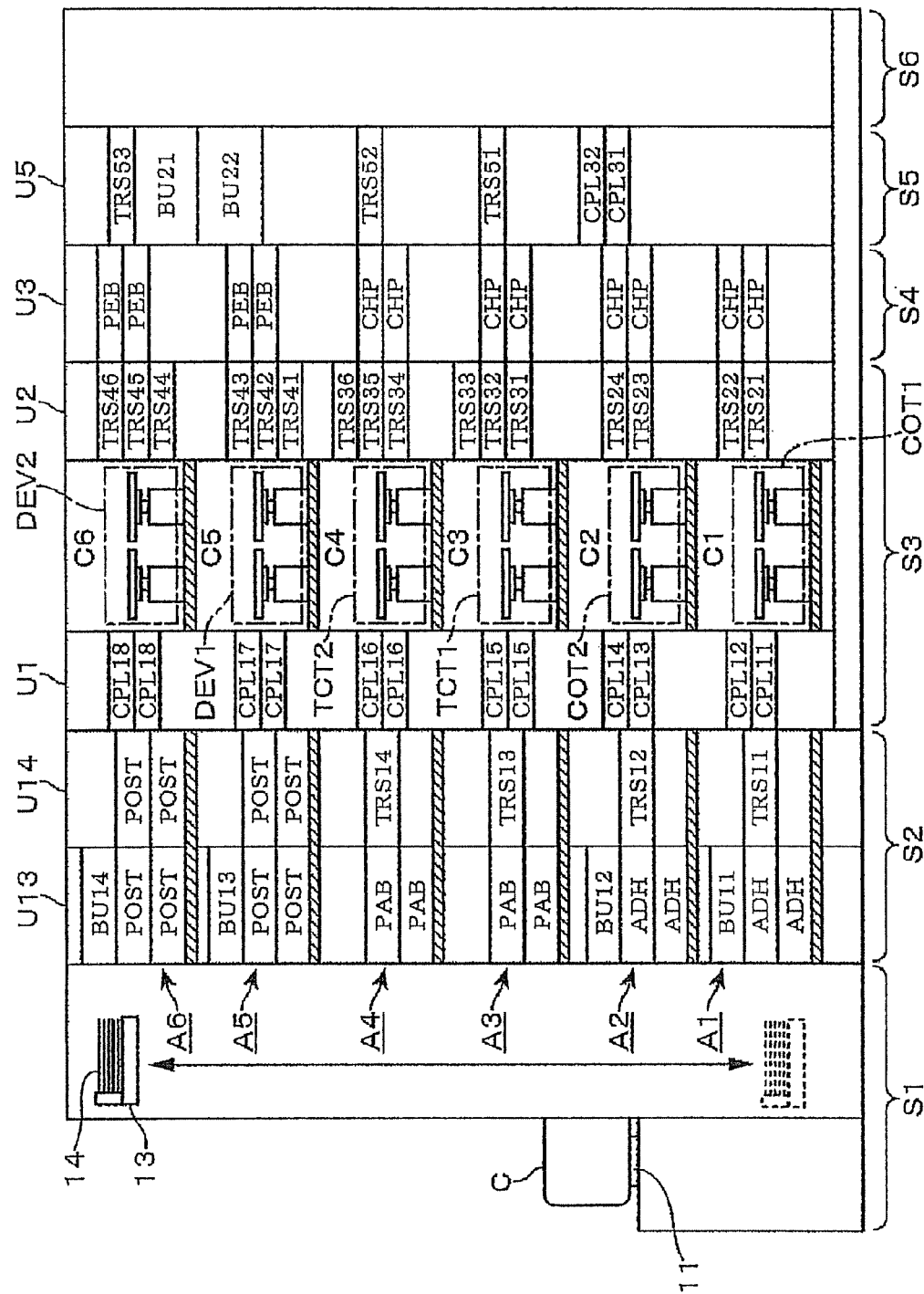
FIG. 3 is a longitudinal sectional side view of the coating and developing apparatus.

As shown in FIGS. 1 and 3, in the liquid process block S3, a shelf unit U1 bridging the respective liquid-process unit blocks C1 to C6 is disposed on the side of the carrier block S1. The shelf unit U1 is composed of a number of modules stacked on one another, i.e., delivery modules CPL disposed at height positions to which the main arms A1 to A6 are accessible. A wafer W is transferred between the liquid process block S3 and the front heating-process related block S2 via these delivery modules CPL of the shelf unit U1. The delivery module described as CPL has a cooling stage for cooing the wafer W placed thereon. In FIG. 3, the delivery modules of the first liquid-process unit block C1 are shown as CPL11 and CPL12, and the delivery modules of the second liquid-process unit block C2 are shown as CPL13 and CPL14. The delivery modules of the third to sixth liquid-process unit blocks C3 to C6 are shown as CPL15 to CPL18.

As shown in FIG. 3, in the liquid process block S3, a shelf unit U2 bridging the first to sixth liquid-process unit blocks C1 to C6 is disposed on the side of the interface block 56. The shelf unit U2 is composed of a number of modules stacked on one another, i.e., delivery modules TRS disposed at height positions corresponding to those of the first to sixth liquid-process unit blocks C1 to C6. A wafer W is transferred between the liquid process block S3 and the rear heating-process related block S4 via these delivery modules TRS of the shelf unit U2. In FIG. 3, the delivery modules of the first liquid-process unit block C1 are shown as TRS21 and TRS22. The delivery modules of the second liquid-process unit bock C2 are shown as TRS23 and TRS24. The delivery modules of the third liquid-process unit block C3 are shown as TRS31 to TRS33. The delivery modules of the fourth liquid-process unit block C4 are shown as TRS34 to TRS36. The delivery modules of the fifth liquid-process unit block C5 are shown as TRS41 to TRS43. The delivery modules of the sixth liquid-process unit block C6 are shown as TRS44 to TRS46.

Next, the rear heating-process related block S4 is described. Delivery arms 17 and 18 constituting a second heating-process related transfer mechanism are arranged in the up and down direction in a center of the rear heating-process related block S4. The delivery arms 17 and 18 are structured similarly to the main arms B and D, excluding that the guide rails 21 are not disposed. The delivery arm 17 can be moved upward downward via respective height positions corresponding to those of the first to fourth liquid-process unit blocks C1 to C4, and can access the modules located on these height positions in the aforementioned shelf unit U2 and the below-mentioned shelf units U3 and U4. The delivery arm 18 can be moved upward and downward via respective height positions corresponding to those of the fifth and sixth liquid-process unit blocks C5 and C6, and can access the modules located on these height positions in the shelf units U2 to U4.

In the rear heating-process related block S4, the shelf units U3 and U4 are located on the right and left sides of the delivery arms 17 and 18. The shelf units U3 and U4 have the same configuration, and the shelf unit U3 shown in FIG. 3 is described as a representative of these shelf units. The shelf unit U3 includes a plurality of heating modules stacked on one another at the same height positions as those of the first to sixth liquid-process unit blocks C1 to C6. The heating modules located at the same height positions as those of the first to fourth liquid-process unit blocks C1 to C4 are shown as CHP, and the heating modules located at the same height positions as those of the fifth and sixth liquid-process unit blocks C5 and C6 are shown as PEB.

The heating modules CHP located at the same height positions as those of the first and second liquid-process unit blocks C1 and C2 are modules for performing a heating process after an antireflection film has been formed. The heating modules CHP located at the same height positions as those of the third and fourth liquid-process unit blocks C3 and C4 are modules for performing a heating process after a protective film has been formed. The heating modules PEB are modules for performing a heating process after a cleaning process has been performed by the after-exposure cleaning module.

The heating modules CHP and PEB have the same configuration with each other, and include a heating plate 41 for heating a wafer W and a cooling plate 42. The cooling plate 42 is adapted to transfer a wafer W between the heating plate 41 and the delivery arm 17, and to cool a heated wafer W. The heating modules POST and PAB of the front heating-process related block S2 have the same configuration as that of the heating modules CHP and PAB.

Figure 7:
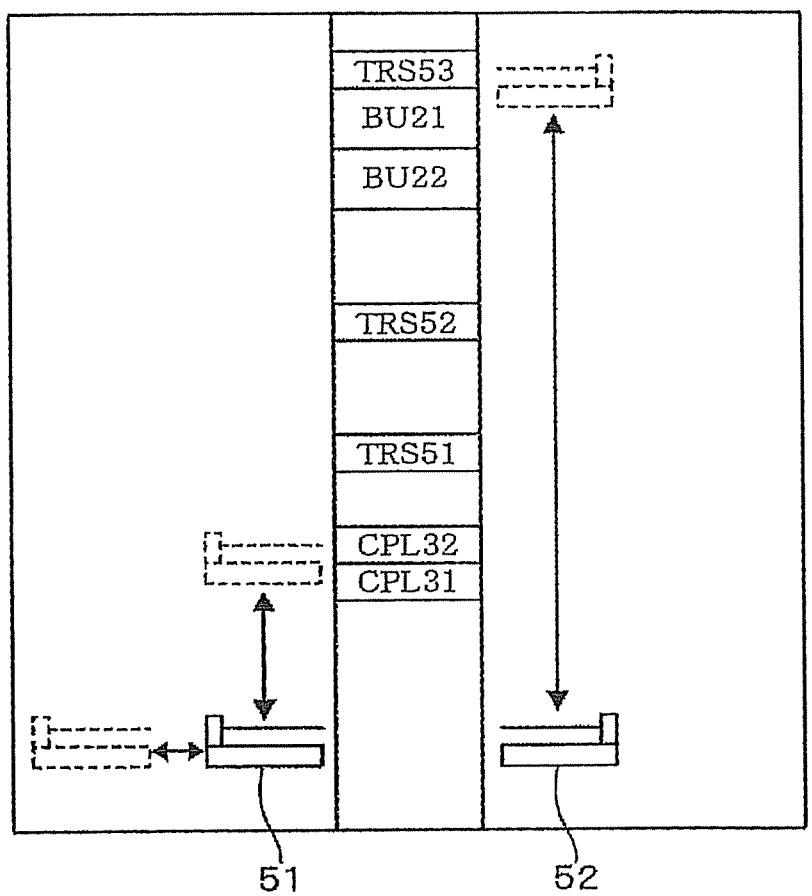
FIG. 7 is a longitudinal sectional front view of an interface block constituting the coating and developing apparatus.

Next, the interface block S5 is described with reference also to FIG. 7 that is a longitudinal sectional front view thereof. The interface block S5 includes a shelf unit U5 composed of a plurality of modules stacked on one another. In a shelf unit U5, there are disposed delivery modules TRS51 and TRS52 at height positions to which the delivery arm 17 is accessible. In addition, there is disposed a delivery module TRS53 at a height position to which the delivery arm 18 is accessible. In addition, the shelf unit U6 is provided with delivery modules BU21, BU22, CPL31 and CPL32.

In addition, the interface block S5 includes interface arms 51 and 52. The interface arms 51 and 52 are configured to be rotatable, movable in the up and down direction, and movable forward and rearward. Further, the interface arm 51 is configured to be movable in the horizontal direction. The interface arm 51 is adapted to access the exposure apparatus S6 and the delivery modules CPL31 and CPL32 and to transfer a wafer W thereamong. The interface arm 52 is adapted to access the respective modules constituting the shelf unit U6 and to transfer a wafer W among these modules.

Figure 8:
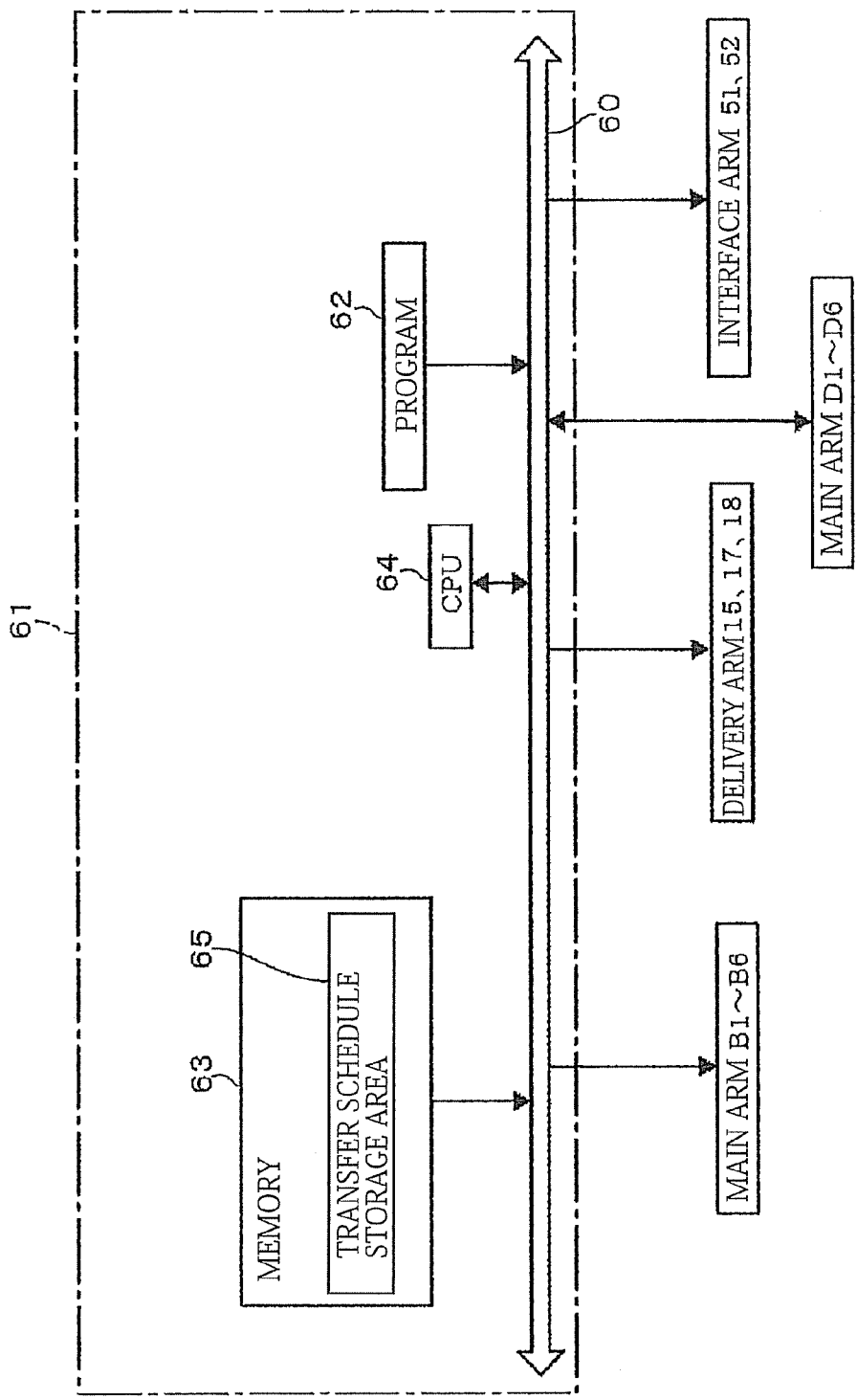
FIG. 8 is a structural view of a control unit disposed on the coating and developing apparatus.

Next, the control unit 61 provided on the coating and developing apparatus 1 is described with reference to FIG. 8. The control unit 61 includes a program 62, a memory 63 and a CPU 64. In the drawings, the reference number 60 depicts a bus. The program 62 incorporates commands (respective steps) by which control signals are transmitted from the control unit 61 to the respective modules and the transfer means of wafer W in the coating and developing apparatus 1 so as to achieve the below-described transfer operation of the wafer W and various processes thereof. The program 62 is stored in a computer non-transitory tangible medium, such as a flexible disc, a compact disc, a hard disc, an MO (magneto optic disc) or a memory card, and is installed in the control unit 61.

The memory 63 has a transfer schedule storage area 65 that stores a transfer schedule in which each ID number of a wafer W in the carrier C and the module to which the wafer W is transferred are related to each other. Based on the transfer schedule, the respective main arms B1 to B6 and D1 to D6, the delivery arms 15, 17 and 18, and the interface arms 51 and 52 are operated whereby the respective wafers W are transferred to the preset modules.

The main arms D1 to D6 of the liquid process block S3 transmit position signals corresponding to their respective positions to the control unit 61. Based on the position signals, the CPU 64 judges whether the main arms D1 to D6 are normally operated or not. When it is judged that the main arms D1 to D6 are normally operated, the transfer of the wafer W is continued in accordance with the preset transfer schedule. When it is judged that at least one of the main arms D1 to D6 is abnormally operated, the transfer schedule is changed, so that a transfer route of the wafer W is changed.

The transfer route of a wafer W in the coating and developing apparatus 1 is described. When the main arms D1 to D6 are operated normally, wafers W are transferred along different routes which are shown by dotted lines in FIGS. 9 and 10. The delivery arm 13 transfers, from the carrier C, wafers W alternately to the delivery module BU11 of the first heating-process related unit block A1 and to the delivery module BU12 of the second heating-process related unit block A2. Namely, in the normal operation, a wafer W (referred to as wafer W1 as a matter of convenience for explanation), which is transferred to the delivery module BU11, is set to be transferred along the route shown in FIG. 9. On the other hand, in the normal operation, a wafer W (referred to as wafer W2 as a matter of convenience for explanation), which is transferred to the delivery module BU12, is set to be transferred along the route shown in FIG. 10.

Figure 9:
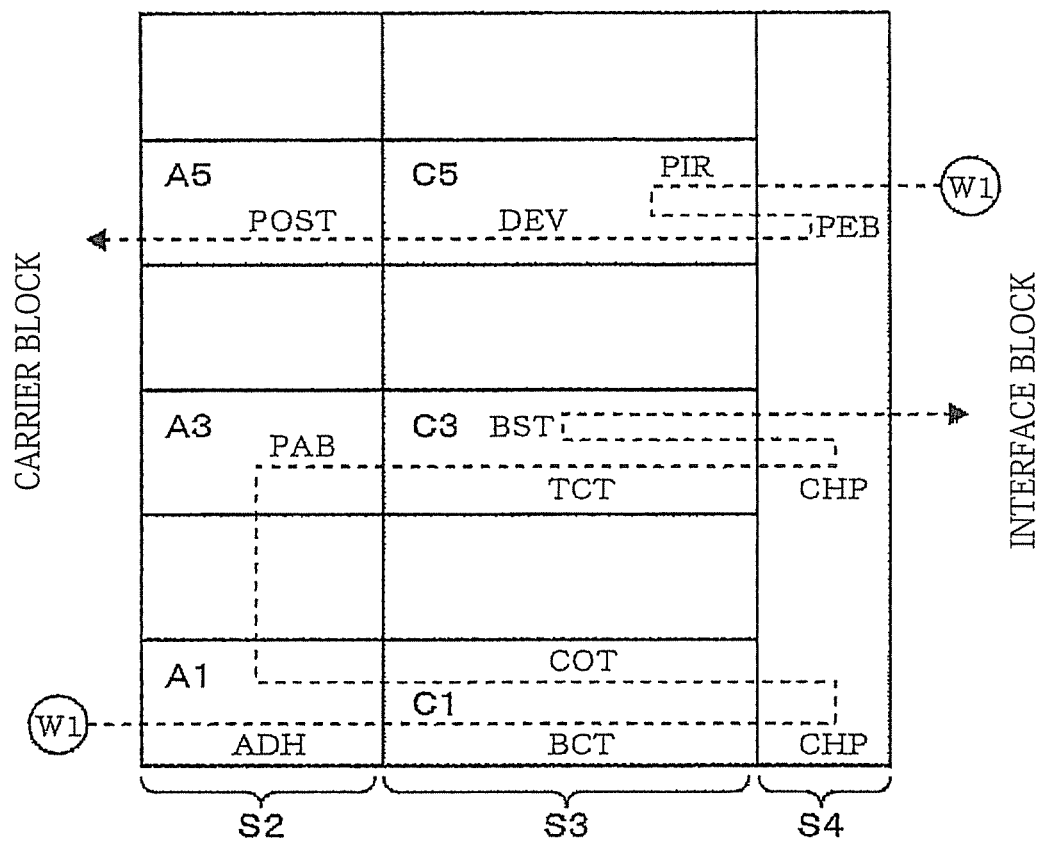
FIG. 9 is a flowchart of a transfer route of a wafer in a normal operation.
Figure 10:
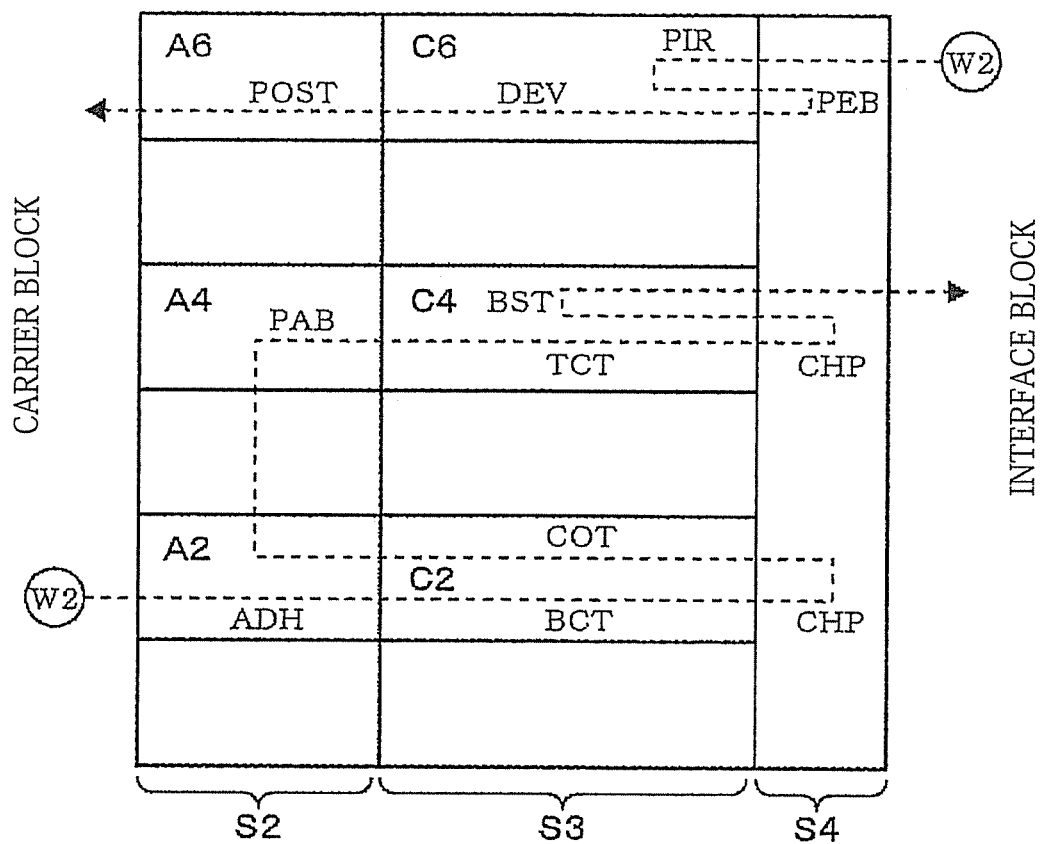
FIG. 10 is a flowchart of the transfer route of the wafer in the normal operation.

The route of the wafer W1 shown in FIG. 9 is described. The wafer W1, which has been transferred to the delivery module BU11, is transferred to the main arm B1 of the first heating-process related unit block A1 and the hydrophobing process modules ADH of the shelf units U11 to U13 in this order, and is subjected to a hydrophobing process. After the hydrophobing process, the wafer W1 is transferred to the main arm B1, the delivery module CPL11 of the shelf unit U1, the main arm D1 of the first liquid-process unit block C1, and the antireflection-film forming module BCT1, in this order, and an antireflection film is formed on the wafer W1.

The wafer W1 on which the antireflection film has been formed is transferred to the main arm D1, the delivery module TRS21 of the shelf unit U2, the delivery arm 17 of the rear heating-process related unit block S4, the heating module CHP located at the height position corresponding to that of the first liquid-process unit block C1, the delivery arm 17, the delivery module TRS22 of the shelf unit U2, the main arm D1, and the resist-film forming module COT1, in this order, and a resist film is formed above the antireflection film.

Thereafter, the wafer W1 is transferred to the main arm B1, the delivery module CPL12, the main arm B1, the delivery module TRS11 of the shelf unit U14, the delivery arm 15, the delivery module TRS13 of the third heating-process related unit block A3, the main arm B3, the heating module PAB, the main arm B3, the delivery module CPL15 of the liquid-process unit block C3, the main arm D3, and the protective-film forming module TCT1, in this order, and a protective film is formed above the resist film.

Subsequently, the wafer W1 is transferred to the main arm D3, the delivery module TRS31 of the shelf unit U2, the delivery arm 17, the heating module CHP located at the height position corresponding to that of the third liquid-process unit block C3, the delivery arm 17, the delivery module TRS32, the main arm D3, the rear-surface cleaning module BST1, the main arm D3, the delivery module TRS33, the delivery arm 17, the delivery module TRS51 of the shelf unit U6, the interface arm 52, the delivery module BU21, the interface arm 52, the delivery module CPL31, the interface arm 51, and the exposure apparatus S7, in this order, and is subjected to an immersion exposure process.

The wafer W1, which has been subjected to the immersion exposure process, is transferred to the interface arm 51, the delivery module CPL32, the interface arm 52, the delivery module BU22, the interface arm 52, the delivery module TRS53, the delivery arm 18, the delivery module TRS41 of the shelf unit U2, the main arm D5 of the fifth liquid-process unit block C5, and the after-exposure cleaning module PIR1, and is subjected to a process for removing the protective film and a cleaning process.

After that, the wafer W1 is transferred to the main arm D5, the delivery module TRS42 of the shelf unit U2, the delivery arm 18, the heating module PEB, the delivery arm 18, the delivery module TRS43, the main arm D5, and the developing module DEV1, in this order, and the wafer W1 is developed. Thereafter, the wafer W1 is transferred to the delivery module CPL17 of the shelf unit U1, the main arm B5 of the fifth heating-process related unit block A5, the heating module POST, the main arm B5, the delivery module BU13, and the delivery arm 13, in this order, and the delivery arm 13 returns the wafer W1 to the carrier C.

Next, the route of the wafer W2, which has been transferred from the carrier C to the delivery module BU12, is described. Although the levels of the modules to which the wafer W2 is transferred are different, the wafer W2 is transferred and processed in the same manner as the wafer W1 which has been transferred to the delivery module BU11. The wafer W2 is transferred to the main arm B2 of the second heating-process related unit block A2, the hydrophobing process modules ADH of the shelf units U11 to U13, the main arm 82, the delivery module CPL13 of the shelf unit U1, the main arm D2 of the second liquid-process unit block C2, the antireflection-film forming module BCT2, the main arm D2, the delivery module TRS23 of the shelf unit U2, the delivery arm 17 of the rear heating-process related unit block S4, the heating module CHP located at the height position corresponding to that of the second liquid-process unit block C2, the delivery arm 17, the delivery module TRS24 of the shelf unit U2, the main arm D1, and the resist-film forming module COT2, in this order.

Thereafter, the wafer W2 is transferred to the main arm B2, the delivery module CPL14, the main arm B2, the delivery module TRS12 of the shelf unit U14, the delivery arm 15, the delivery module TRS14 of the fourth heating-process related unit block A4, the main arm 84, the heating module PAB, the main arm 84, the delivery module CPL16, the main arm D3 of the fourth liquid-process unit block C4, the protective-film forming module TCT2, the main arm D4, the delivery module TRS34 of the shelf unit U2, the delivery arm 17, the heating module CHP located at the height position corresponding that of the fourth liquid-process unit block C4, the delivery arm 17, the delivery module TRS35, the main arm D4, the rear-surface cleaning module BST2, the main arm D4, the delivery module TRS36, the delivery arm 17, and the delivery module TRS51 of the shelf unit U6. Hereafter, the wafer W2 is transferred in the interface block S5 along the same route as that of the aforementioned route. After the wafer W2 has been subjected to an immersion exposure process, the wafer W2 is transferred to the delivery module TRS53.

Subsequently, the wafer W2 is transferred to the delivery arm 18, the delivery module TRS44 of the shelf unit U2, the main arm D6 of the sixth liquid-process unit block C6, the after-exposure cleaning module PIR1, the main arm D6, the delivery module TRS45 of the shelf unit U2, the delivery arm 18, the heating module PEB, the delivery arm 18, the delivery module TRS46, the main arm D6, the developing module DEV2, the delivery module CPL18 of the shelf unit U1, the main arm B6 of the sixth heating-process related unit block A6, the heating module POST, the main arm B6, the delivery module BU14, the delivery arm 13, in this order, and the delivery arm 13 returns the wafer W2 to the carrier C.

When the control unit 61 judges that one of the main arms D1 to D6 of the liquid process block S3 fails (becomes abnormal), the operation of the main arm D, which is judged to be failed, is stopped. The control unit 61 stops the transfer of the wafer W to the liquid process unit block C that includes the main arm D, which has been judged to be failed, and the transfer of the wafer W to the heating-process related unit block A corresponding to this liquid process unit block C. Simultaneously therewith, the control unit 61 changes the transfer schedule such that the wafer W is transferred to the liquid process unit block C that is a counterpart of the liquid process unit block C including the failed main arm D, and to the heating-process related unit block A corresponding to this liquid process unit block C. In this manner, the transfer schedule is changed such that the transfer of the wafer W to the liquid process unit block C having the failed main arm D is avoided, but that the transfer of the wafer W is continued without avoiding the transfer of the wafer W to the unit block not having the failed main arm D.

Figure 11:
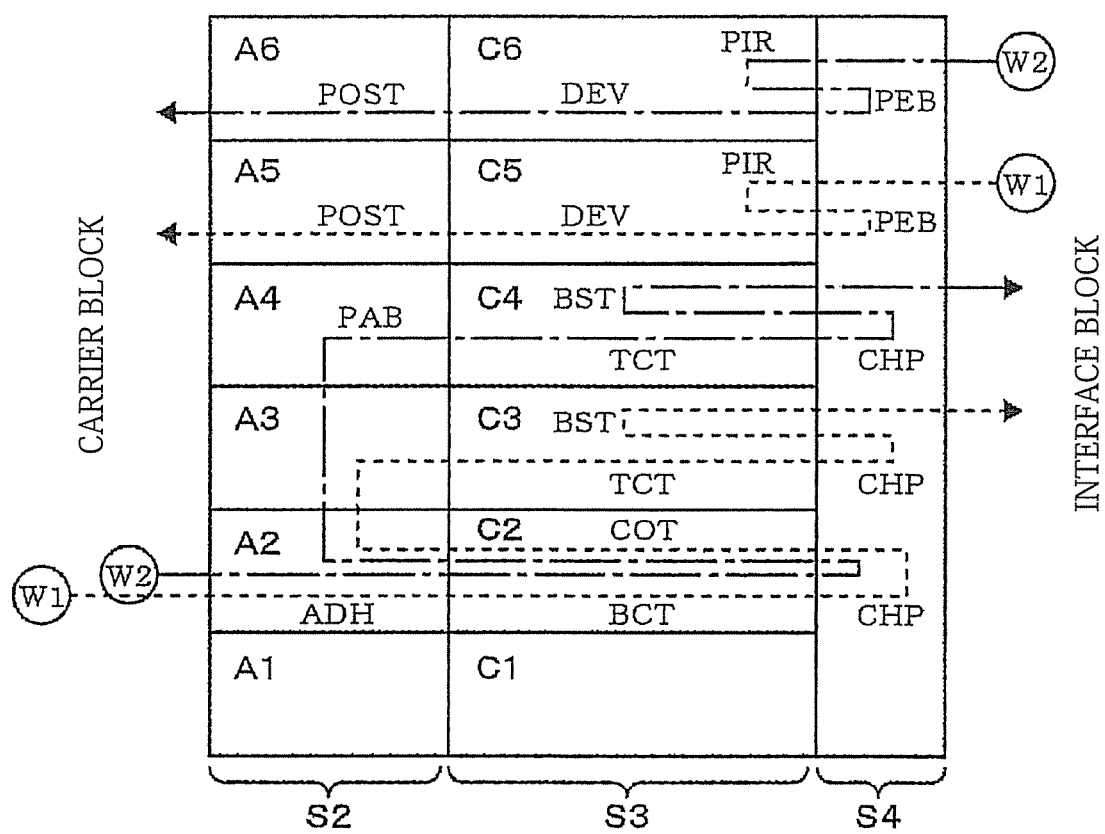
FIG. 11 is a flowchart of a transfer route of a wafer in an abnormal operation.

An example of the case in which the main arm D of the first liquid-process unit block C1 fails is concretely described with reference to FIG. 11. When the main arm D1 fails, the transfer of the wafer W1 to the first liquid-process unit block C1 and the first heating-process related unit block A1 corresponding to this liquid-process unit block C1 is stopped. The wafer W1, which has been set to be transferred to the first liquid-process unit block C1 and the first heating-process related unit block A1, is transferred from the carrier C to the delivery module BU12. Then, the wafer W1 is transferred from the delivery module BU12 to the second heating-process related unit block A2 and the second liquid-process unit block C2, along the same route as that of the wafer W2, and processed. In FIG. 11, the transfer route of the wafer W1 is depicted by the dotted arrow.

After the wafer W1 has been processed in the second liquid-process unit block C2 and the second heating-process related unit block A2, the wafer W1 is transferred to the delivery module TRS12 of the shelf unit U14. Then, similarly to the normal operation, the wafer W1 is loaded by the delivery arm 15 into the delivery module TRS13 of the third heating-process related unit block A3. After that, similarly to the normal operation, the wafer W1 is transferred to the liquid process unit blocks C3 and C5 and the heating-process related unit blocks A3 and A5, and processed. As shown by the chain-line arrow, the wafer W2, which has been loaded into the second liquid-process unit block C2, is transferred along the same route as the route of the normal operation, and processed.

When the main arm D2 of the second liquid-process unit block C2 fails, similarly to the case in which the main arm D1 fails, the wafer W2, which has been set to be processed in the second liquid-process unit block C2, is transferred from the carrier C to the delivery module BU11. Then, the wafer W2 is transferred to the first liquid-process unit block C1 and the first heating-process related unit block A1, and processed. Thereafter, the wafer W2, which has been transferred to the delivery module TRS11 of the shelf unit U14, is loaded by the delivery arm 15 into the delivery module TRS14 of the fourth heating-process related unit block A4, similarly to the normal operation. Subsequently, the wafer W2 is transferred to the liquid-process unit blocks C4 and C6 and the heating-process related unit blocks A4 and A6 and processed, similarly to the normal operation.

When the main arm D3 of the third liquid-process unit block C3 fails, the wafer W1, which has been set to be transferred to the third liquid-process unit block C3, is transferred to the first heating-process related unit block A1 and the first liquid-process unit block C1, and processed. After that, the wafer W1 is transferred, not to the third liquid-process unit block C3 and the third heating-process related unit block A3, but to the fourth liquid-process unit block C4 and the fourth heating-process related unit block A4. Then, after the wafer W1 has been processed in the unit blocks C4 and A4, the wafer W1 is transferred to the fifth liquid-process unit block C5 and the fifth heating-process related unit block A5, and processed.

Similarly, when the main arm D4 of the fourth liquid-process unit block C4 fails, after the wafer W2 has been processed in the second heating-process related unit block A2 and the second liquid-process unit block C2, the wafer W2 is transferred, not to the fourth liquid-process unit block C4 and the fourth heating-process related unit block A4, but to the third liquid-process unit block C3 and the third heating-process related unit block A3. Then, after the wafer W2 has been processed in the unit blocks C3 and A3, the wafer W2 is transferred to the sixth liquid-process unit block C6 and the sixth heating-process related unit block A6, and processed.

When the main arm D5 of the fifth liquid-process unit block C5 fails, after the wafer W1 has been exposed, the wafer W1 is transferred to the sixth liquid-process unit block C6 and the sixth heating-process related unit block A6. When the main arm D6 of the sixth liquid-process unit block C6 fails, after the wafer W2 has been exposed, the wafer W2 is transferred to the fifth liquid-process unit block C5 and the fifth heating-process related unit block A5.

In addition, a user can specify the liquid-process unit block C to be maintained from the control unit 61. Also in this case in which the certain liquid-process unit block C is specified, the control unit 61 controls the transfer of the wafer W such that the transfer of the wafer W to the specified liquid-process unit block C and the heating-process related unit block A corresponding to this liquid-process unit block is avoided, which is similar to the case in which the main arm D has trouble.

In the process block S20 constituting the coating and developing apparatus 1 of the present invention, the front heating-process related block S2, the liquid process block S3, and the rear heating-process related block S4 are arranged in this order from the front side to the rear side. The liquid process block S3 is structured by stacking: the unit blocks C1 and C2 for preprocessing, each including the antireflection-film forming module BCT for forming an antireflection film, the resist-film forming and coating module COT for forming a resist film, and the main arm D; the unit blocks C3 and C4 for post-processing, each including the protective-film forming module TCT, the cleaning module BST for performing a cleaning process before exposure, and the main arm D; and the unit blocks C5 and C6 for developing, each including the developing module DEV for performing a developing operation, and the main arm D. Thus, the installation area of the apparatus can be reduced. Further, each unit block C is formed by stacking doubled unit blocks C of the same configuration. Thus, even when one of the doubled unit blocks C becomes unavailable, the process of a wafer W can be continuously performed by using the other liquid-process unit block C, whereby lowering of process efficiency can be restrained.

In addition, when it is impossible to process a wafer W in the certain heating-process related unit block A because the main arm B is out of order or maintained, the transfer of the wafer W may be controlled such that the transfer of the wafer W to this heating-process related unit block A and the liquid-process unit block C corresponding to this heating-process related unit block A is avoided. In this embodiment and another embodiment, a film to be formed in the third liquid-process unit block C3 is not limited to a protective film, but may be an antireflection film deposited above a resist, for example. In addition, the main arm of the liquid-process unit blocks C5 and C6 may be shared. To be specific, the main arm D5 can be moved upward and downward along the liquid-process unit blocks C5 and C6 so as to transfer a wafer W among the respective modules of the liquid-process unit blocks C5 and C6. In the case in which each of the liquid-process unit blocks C5 and C6 is provided with the main arm D, even if one of the main arms D5 and D6 has trouble, the transfer of the wafer W can be continued by using the other main arm D.

The invention claimed is:
1. A coating and developing apparatus comprising:
a carrier block;
a process block to which a substrate that has been loaded into the carrier block by a carrier is delivered, the process block being configured to form a coating film including a resist film on the substrate;
an interface block arranged on an opposed side of the carrier block with respect to the process block; and
an exposure apparatus configured to expose the substrate that has been transferred thereto form the process block via the interface block;

wherein:
the substrate that has been loaded into the carrier block by the carrier is delivered to the process block, a coating film including a resist film is formed on the substrate in the process block, the substrate is transferred to the exposure apparatus via the interface block, the exposed substrate, which has been returned to the process block via the interface block, is developed in the process block, and the developed substrate is delivered to the carrier block;

in the process block, there are arranged a group of liquid-process related unit blocks arranged on the carrier block side, a first heating-process related block arranged on the carrier block side of the group of liquid-process related unit blocks, a second heating-process related block arranged on the interface block side of the group of liquid-process related unit block;

the group of liquid-process related unit blocks are composed of:

a first unit block for preprocessing and a second unit block for preprocessing which are doubled and stacked on one another in an up and down direction, each unit block for preprocessing including a liquid process module for a lower layer configured to supply a chemical liquid for forming an antireflection film as a lower layer on the substrate, a coating module configured to supply a resist liquid for forming a resist film on the antireflection film, and a transfer mechanism for the unit block configured to be moved along a linear transfer path connecting the carrier block and the interface block for transferring a substrate between the modules;

a first unit block for post-processing and a second unit block for post-processing which are doubled, stacked on one another in the up and down direction and stacked above the unit blocks for preprocessing, each unit block for post-processing including a liquid process module for an upper layer configured to supply a chemical liquid for forming an upper layer film on the substrate on which a resist film has been formed, a cleaning module configured to perform a cleaning operation before exposure, and a transfer mechanism for the unit block configured to be moved along a linear transfer path connecting the carrier block and the interface block for transferring a substrate between the modules; and a unit block for developing stacked on the unit blocks for preprocessing, including a liquid process module configured to supply a developing liquid to the substrate, and a transfer mechanism for the unit block configured to be moved along a linear transfer path connecting the carrier block and the interface block;

in the first heating-process related block, there are provided: a plurality of heating modules stacked on one another in the up and down direction in which a heating module configured to heat the substrate to which the resist liquid has been coated in the unit block for preprocessing, and a heating module configured to heat the substrate that has been developed in the unit block for developing are allocated to these heating modules; and a first heating-process related transfer mechanism capable of being moved upward and downward for transferring the substrate among the heating modules;

in the second heating-process related block, there are provided: a plurality of heating modules stacked on one another in the up and down direction in which a heating module configured to heat the substrate to which a chemical liquid for forming an antireflection film has been coated in the unit block for preprocessing, a heating module configured to heat the substrate to which a chemical liquid for forming an upper layer film has been coated in the unit block for post-processing, and a heating module configured to heat the substrate which is not yet developed in the unit block for developing, are allocated to these heating modules, and a second heating-process related transfer mechanism capable of being moved upward and downward for transferring the substrate among the heating modules;

disposed on the carrier block side of the unit block for developing is a delivery stage to which the developed substrate is carried by the transfer mechanism, and disposed on the carrier block side of the unit block for preprocessing is a delivery stage via which the substrate carried out from the carrier is delivered to the transfer mechanism of this unit block;

disposed on the carrier block side of the unit block for preprocessing is a delivery stage via which the substrate coated with the resist liquid is carried to the first heating-process related block, and disposed on the carrier block side of the unit block for post-processing is a delivery stage on which the substrate with the resist film formed thereon is received by the transfer mechanism of this unit block;

disposed on the interface block side of the unit block for preprocessing are a delivery stage via which the substrate coated with the antireflection film is carried to the second heating-process related block and a delivery stage on which the substrate heated in the second heating-process related block is received by the transfer mechanism of this unit block, and disposed on the interface block side of the unit block for post-processing is a delivery stage via which the substrate with an upper layer film formed thereon is delivered to the transfer mechanism of the second heating-process related block.

2. The coating and developing apparatus according to claim 1, wherein
in the first heating-process related block, there are provided: unit portions that are stacked on one another at plural levels, each unit portion including, when a direction along which the linear transfer path extends is a back and forth direction, a linear transfer path extending in the back and forth direction, a plurality of heating modules disposed along the liner transfer path; and a horizontal transfer mechanism configured to be moved along the linear transfer path for transferring the substrate among the heating modules and the delivery stages; and an up and down transfer mechanism configured to transfer the substrate among the respective unit portions.

3. The coating and developing apparatus according to claim 1, wherein
the unit block for developing further includes a cleaning module configured to clean the exposed substrate, the substrate being delivered thereto by the transfer mechanism for this unit block.

4. A coating and developing method using the coating and developing apparatus according to claim 1, comprising;
transferring a substrate, to which a chemical liquid for forming an antireflection film has been coated in the unit block for preprocessing, to the second heating-process related block;
transferring then the substrate, which has been heated in the heating module of the second heating-process related block, to the unit block for preprocessing by the second heating-process related transfer mechanism;

transferring the substrate, to which a resist liquid has been formed in the unit block for preprocessing, to the first heating-process related block;

transferring the substrate to the unit block for post-processing by the first heating-process related transfer mechanism; and transferring substrate, to which a chemical liquid for forming an upper layer film has been coated in the unit block for post-processing, to the second heating-process related block.

5. A non-transitory tangible medium storing a computer program for use in a coating and developing apparatus, the computer program being a program for performing the coating and developing method according to claim 4.

* * * * *